United States Patent
Gu et al.

(10) Patent No.: US 9,112,520 B2
(45) Date of Patent: Aug. 18, 2015

(54) TRANSMISSION INTERFACE AND SYSTEM USING THE SAME

(71) Applicant: MediaTek Inc., Hsin-Chu (TW)

(72) Inventors: Wei-Cheng Gu, Hsinchu (TW);
Chung-Hung Tsai, Chu-Pei (TW);
Chun-Nan Li, Jhuci Township (TW);
Yi-Hsi Chen, Toucheng Township, Yilan County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/144,663

(22) Filed: Dec. 31, 2013

(65) Prior Publication Data

US 2014/0111360 A1 Apr. 24, 2014

Related U.S. Application Data

(63) Continuation-in-part of application No. 12/855,595, filed on Aug. 12, 2010, now Pat. No. 8,648,739.

(51) Int. Cl.
| | |
|---|---|
| *H03M 9/00* | (2006.01) |
| *G06F 13/00* | (2006.01) |
| *H04N 5/04* | (2006.01) |
| *H04N 21/4363* | (2011.01) |
| *H04N 5/374* | (2011.01) |
| *H04N 5/376* | (2011.01) |
| *H04L 7/00* | (2006.01) |

(52) U.S. Cl.
CPC ............... *H03M 9/00* (2013.01); *G06F 13/00* (2013.01); *H04N 5/04* (2013.01); *H04N 5/3741* (2013.01); *H04N 5/3765* (2013.01); *H04N 21/43632* (2013.01); *H04L 7/0008* (2013.01)

(58) Field of Classification Search
CPC ...... H03M 9/00; H04N 5/3741; H04N 5/3765; H04N 5/04; G06F 13/00
USPC .......................... 341/100, 101; 375/376, 368
See application file for complete search history.

(56) References Cited

U.S. PATENT DOCUMENTS

| | | |
|---|---|---|
| 5,375,224 A | 12/1994 | Larsen et al. |
| 5,708,684 A | 1/1998 | Ueda |
| 5,796,794 A | 8/1998 | Kim |
| 6,232,895 B1 | 5/2001 | Djupsjobacka et al. |
| 6,509,851 B1 | 1/2003 | Clark et al. |
| 6,628,214 B1 | 9/2003 | Kawase et al. |
| 6,693,986 B2 | 2/2004 | Nemoto |
| 7,535,957 B2 | 5/2009 | Ozawa et al. |
| 7,545,205 B2 | 6/2009 | Tang et al. |
| 7,590,211 B1 | 9/2009 | Burney |
| 7,716,507 B1 | 5/2010 | Kang |
| 7,758,900 B2 | 7/2010 | Chang et al. |
| 8,000,600 B2 | 8/2011 | Girardi et al. |
| 2003/0095057 A1 | 5/2003 | Gredone et al. |
| 2009/0052599 A1 | 2/2009 | Yanagisawa et al. |

FOREIGN PATENT DOCUMENTS

| | | |
|---|---|---|
| TW | 592413 | 6/2004 |
| TW | 200719150 | 5/2007 |

OTHER PUBLICATIONS

English language translation of abstract of TW 200719150 (published May 16, 2007).

*Primary Examiner* — Peguy Jean Pierre
(74) *Attorney, Agent, or Firm* — McClure, Qualey & Rodack, LLP

(57) ABSTRACT

A transmission interface includes a first pin, a second pin, a conversion unit, and a decoding unit. The conversion unit receives a serial input data stream via the first pin and receives a serial clock via the second pin. The conversion unit converts the serial input data stream to parallel input data and converts the serial clock to a parallel clock. The serial input data stream has a full swing form. The decoding unit receives and decodes the parallel input data and generates an input data signal according to the decoded parallel input data.

20 Claims, 10 Drawing Sheets

TRANSMISSION INTERFACE AND SYSTEM USING THE SAME

CROSS REFERENCE TO RELATED APPLICATIONS

The present application is a continuation-in-part application of and claims priority from U.S. patent application Ser. No. 12/855,595, filed Aug. 12, 2010, the content of which is hereby incorporated by reference in its entirety.

BACKGROUND OF THE INVENTION

1. Field of the Invention

The invention relates to a transmission interface, and more particularly to a serial transmission interface.

2. Description of the Related Art

In an electronic system, data between two devices is transmitted through an interface. For example, in a camera system, a camera interface is used to transmit data between a sensor and a processor. The camera interface may be implemented by a parallel interface or a serial interface. If a parallel camera interface is used, both of the sensor and the camera interface have many pins for parallel data transmission, increasing the total area of the camera system. If a serial camera interface is used, both of the sensor and the camera interface have less pins. However, since differential signals are used for data transmission in the serial camera interface, the camera interface requires additional analog circuits to deal with the differential signals.

Thus, it is desired to provide a new transmission interface to solve the above problems.

BRIEF SUMMARY OF THE INVENTION

An exemplary embodiment of a transmission interface comprises a first pin, a second pin, a conversion unit, and a decoding unit. The conversion unit receives a first serial input data stream via the first pin and receives a serial clock via the second pin. The conversion unit converts the first serial input data stream to parallel input data and converts the serial clock to a parallel clock. The first serial input data stream has a full swing form. The decoding unit receives and decodes the parallel input data and generates an input data signal according to the decoded parallel input data.

An exemplary embodiment of an electronic system comprises a transmission device, an interface, and a processing device. The transmission device generates a first serial input data stream and a serial clock. The first serial input data stream has a full swing form. The interface receives the first serial input data stream and the serial clock and comprises a first pin, a second pin, a conversion unit, and a decoding unit. The first conversion unit receives the first serial input data stream via the first pin and receives the serial clock via the second pin. The first conversion unit further converts the first serial input data stream to first parallel input data and converts the serial clock to a first parallel clock. The decoding unit receives and decodes the first parallel input data and generates an input data signal according to the decoded parallel input data. The processing device receives and processes the input data signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
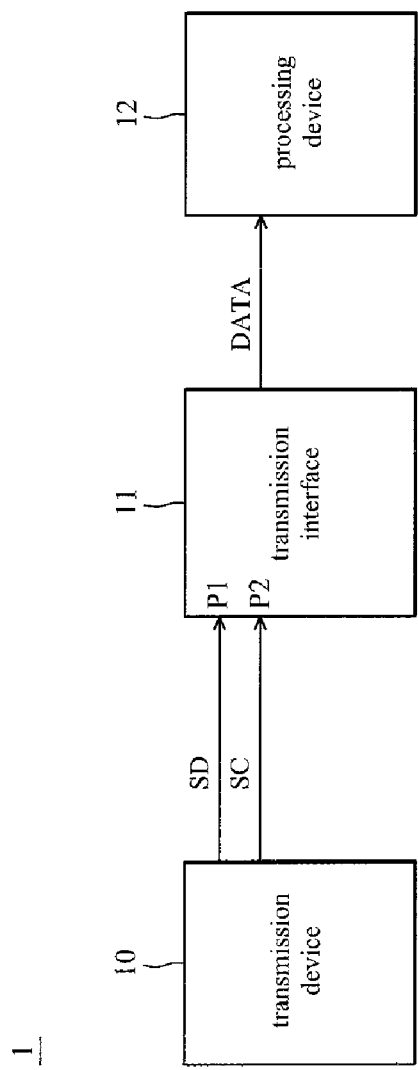
FIGS. 1A and 1B show exemplary embodiments of an electronic system.

Electronic systems are provided. In an exemplary embodiment of an electronic system in FIG. 1A, an electronic system 1 comprises a transmission device 10, a transmission interface 11, and a processing device 12. In the electronic system 1, the transmission device 10 provides a serial input data stream SD and a serial clock SC. The serial input data stream SD has a full swing form. The serial input data stream SD can be transmitted from the transmission device 10 at double data rate. Namely the serial input data stream SD can be transmitted on both the rising and the falling edges of the clock signal serial clock SC. The transmission interface 11 receives the serial input data stream SD via a pin P1 and the serial clock SC via a pin P2 and generates an input data signal DATA according to the serial input data stream SD to the processing device 12.

Figure 1B:
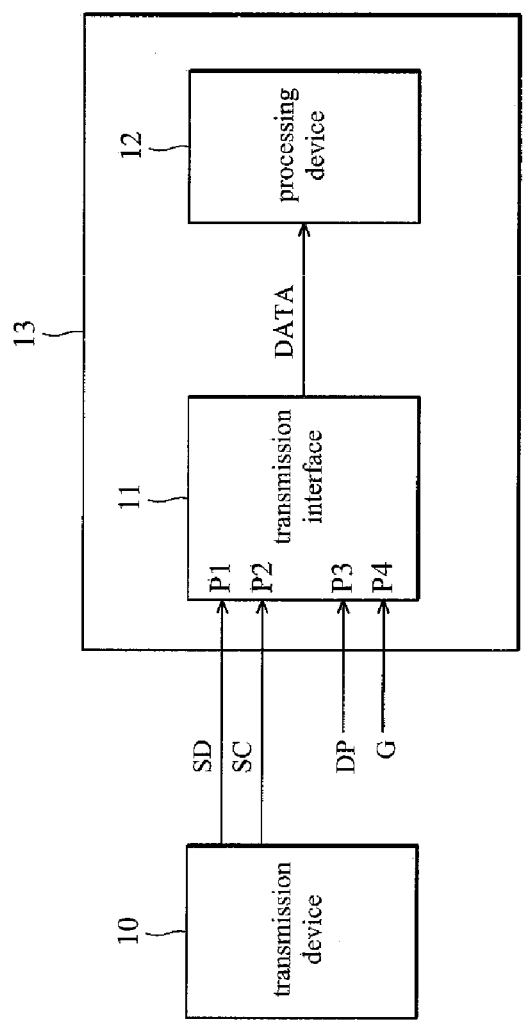

Referring to FIG. 1B, the transmission interface 11 and the processing device 12 can be combined into a receiving device 13. The transmission interface 11 receives a digital power DP via a pin P3. Moreover, the transmission interface 11 is coupled to a ground G via a pin P4 for ground reference In the following embodiment, the electronic system 1 is implemented by a camera system for detailed description. However, the electronic system 1 could also be a display system or any other electronic system requires a transmission interface. In an embodiment that the electronic system 1 is a display system, the transmission device 10 can be a display controller, the processing device 12 can be a driver IC of a display module. In this embodiment, the transmission device 10 of the camera system 1 can be implemented by an image sensor. The image sensor 10 is used to detect images and provides the serial input data stream SD according to the detected images. The image sensor 10 may also provides the serial clock SC. In some embodiments, the serial clock SC will vary according to the detected images.

Figure 2A:
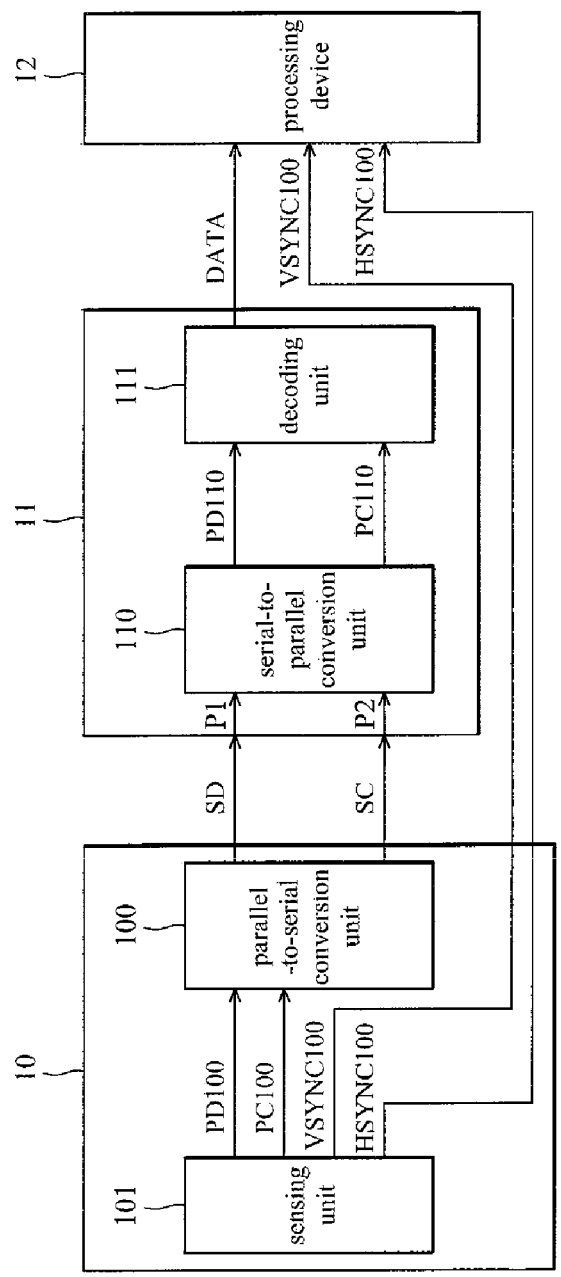
FIGS. 2A and 2B show other exemplary embodiments of an electronic system.

Referring to FIG. 2A, the image sensor 10 comprises a parallel-to-serial conversion unit 100 and a sensing unit 101. The sensing unit 101 generates parallel data PD100, a parallel clock PC100, a vertical synchronization signal VSYNC100, and a horizontal synchronization signal HSYNC100 according to the detection operation. The parallel-to-serial conversion unit 100 converts the parallel data PD100 to the serial input data stream SD with the full swing form and further converts the parallel clock PC100 to the serial clock SC with the full swing form. The image sensor 10 then provides the serial input data stream SD and the serial clock SC to the transmission interface 11.

The transmission interface 11 comprises a serial-to-parallel conversion unit 110 and a decoding unit 111. The serial-to-parallel conversion unit 110 receives the serial input data stream SD via the pin P1 and the serial clock SC via the pin P2. The serial-to-parallel conversion unit 110 converts the serial input data stream SD to parallel input data PD110 and converts the serial clock SC to a parallel clock PC110. The decoding unit 111 receives and decodes the parallel input data PD110. The decoding unit 111 then generates the input data signal DATA according to the decoded parallel input data PD110. The processing device 12 receives the input data signal DATA from the decoding unit 111. The processing device 12 further receives the vertical synchronization signal VSYNC100 and the horizontal synchronization signal HSYNC100 from the sensing unit 101 of the image sensor 10. The processing device 12 then processes the input data signal DATA according to the vertical synchronization signal VSYNC100 and the horizontal synchronization signal HSYNC100.

Figure 2B:
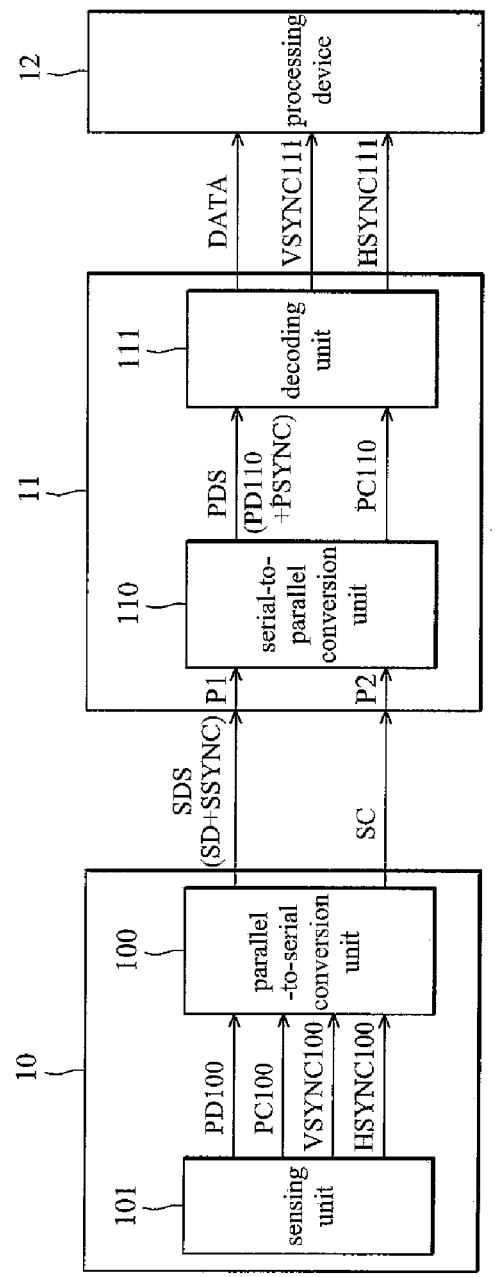

In some embodiments, as shown in FIG. 2B, the parallel-to-serial conversion unit 100 of the image sensor 10 further receives the vertical synchronization signal VSYNC100 and the horizontal synchronization signal HSYNC100 from the sensing unit 101 and generates serial synchronization data stream SSYNC with the full swing according to the vertical synchronization signal VSYNC100 and the horizontal synchronization signal HSYNC100. The parallel-to-serial conversion unit 100 merges the serial synchronization data stream SSYNC with the serial input data stream SD to form a serial image data stream SDS with the full swing form. The serial-to-parallel conversion unit 110 of the transmission interface 11 receives the serial image data stream SDS via the pin P1. The serial-to-parallel conversion unit 110 converts the serial image data stream SDS to parallel image data PDS. In other words, the parallel image data PDS is composed of the parallel input data PD110 which is converted from the serial input data stream SD and parallel synchronization data PSYNC which is converted from the serial synchronization data stream SSYNC. The decoding unit 111 receives and decodes the parallel synchronization data PSYNC and generates a vertical synchronization signal VSYNC111 and a horizontal synchronization signal HSYNC111 according to the decoded parallel synchronization data PSYNC and the parallel clock PC110. The processing device 12 processes the input data signal DATA according to the vertical synchronization signal VSYNC111 and the horizontal synchronization signal HSYNC111.

According to the transmission interface 11 of the embodiment, the data transmission interface between the transmission device 10 and the receiving device 13 is a serial interface, decreasing the numbers of pins of the transmission device 10 and the transmission interface 11. Moreover, since the serial input data stream SD/serial image data stream SDS and the serial clock SC have a full swing form, analog circuits dealing with differential signals can be omitted, and the cost could be further decreased.

In the embodiments of FIGS. 1A-1B and 2A-2B, at least one of the serial input data stream SD and the serial image data stream SDS is in a packet format. Thus, the decoding unit 111 can also perform a de-packet operation to de-packet the serial input data stream SD and/or the serial image data stream SDS. In the following, the camera system in FIG. 2B is given as an example to describe packet types of the serial image data stream SDS. It should be noted that this invention applies not only to a camera system, but also to a display system or any other electronic system requires a transmission interface. It should also be noted that the transmission interface 11 can be configured to include a plurality of data channels. Besides the pin P1 receiving the serial input data stream SD or the serial image data stream SDS, there can be additional pin(s) for receiving additional serial input data stream(s) SD or the serial image data stream(s) SDS. For example, there can be a fifth pin for receiving another one serial input data stream SD or the serial image data stream SDS, or a fifth, sixth and seventh pins for receiving another three serial input data streams SD or the serial image data streams SDS.

Figure 3:
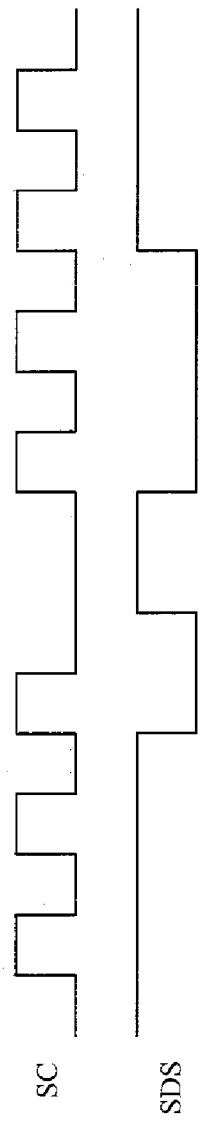
FIG. 3 is a timing diagram of the serial image data stream SDS and the serial clock SC.

FIG. 3 is a timing diagram of the serial image data stream SDS and the serial clock SC. Referring to FIG. 3, when the serial image data stream SDS is valid, the serial clock SC toggles, and otherwise the serial clock SC is tied to a logic low level "0".

In the embodiment of the camera system, packets in the serial image data stream SDS are of at least one of four types: a frame start packet, a frame end packet, a line start packet, and a data packet. It should be noted that this invention applies not only to a camera system, but also to a display system or any other electronic system requires a transmission interface. In the following, the serial image data stream SDS having packets of the four types is given as an example. Each packet has a synchronization code (referred to "SYNC code") to indicate the beginning of the packet. In this embodiment, an SYNC code occupies 3 bytes, and the value of SYNC code is "24'hffffff. An SYNC code is followed by a packet identification code (referred to "packet ID"), and each packet can be identified according to the value of the corresponding packet ID in the packet. Table 1 shows values of packet ID and the corresponding packet type.

TABLE 1

| SYNC code | packet ID | Packet type |
| --- | --- | --- |
| 24'hffffff | 8'h01 | frame start packet |
| 24'hffffff | 8'h00 | frame end packet |
| 24'hffffff | 8'h02 | line start packet |
| 24'hffffff | 8'h40 | data packet |

Figure 4A:
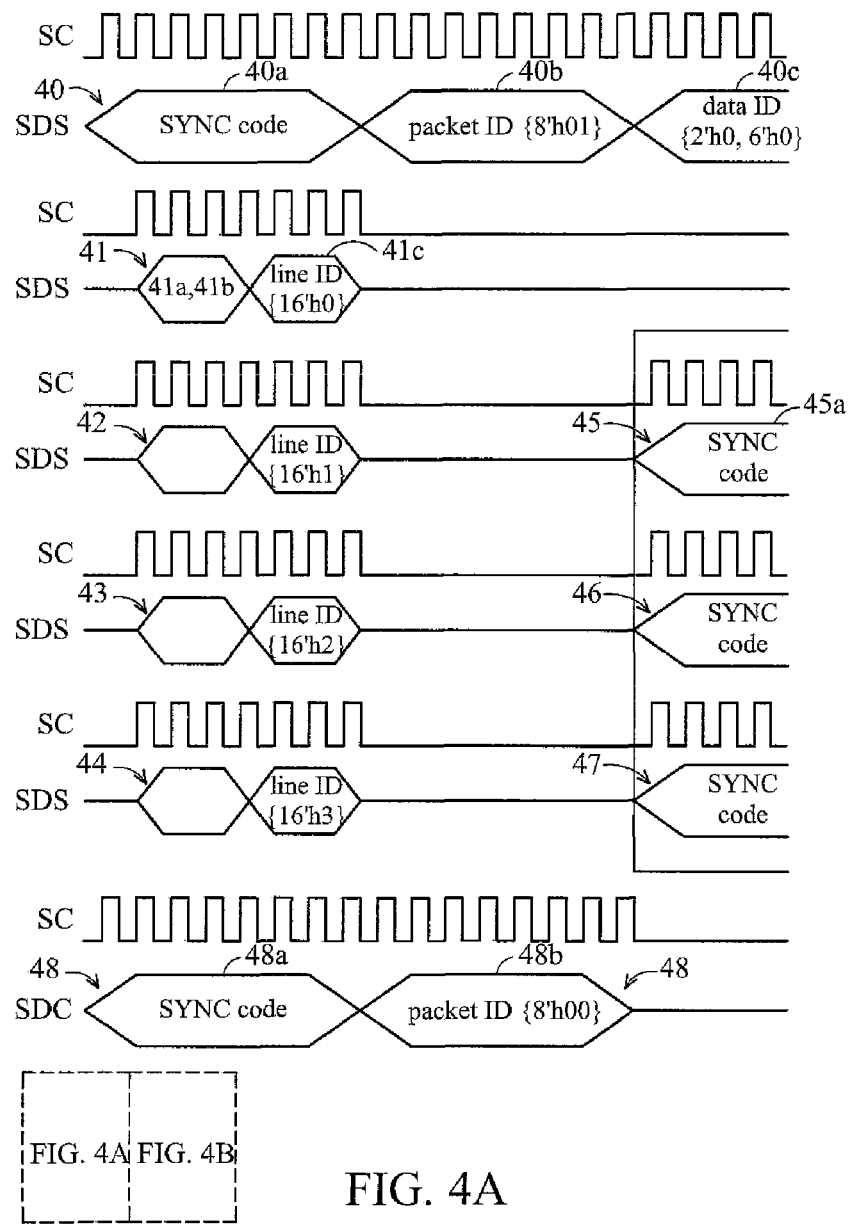
FIGS. 4A-4C shows an exemplary embodiment of the formats of the frame start packet, the frame end packet, the line start packet, and the data packet of the serial image data stream.
Figure 4B:
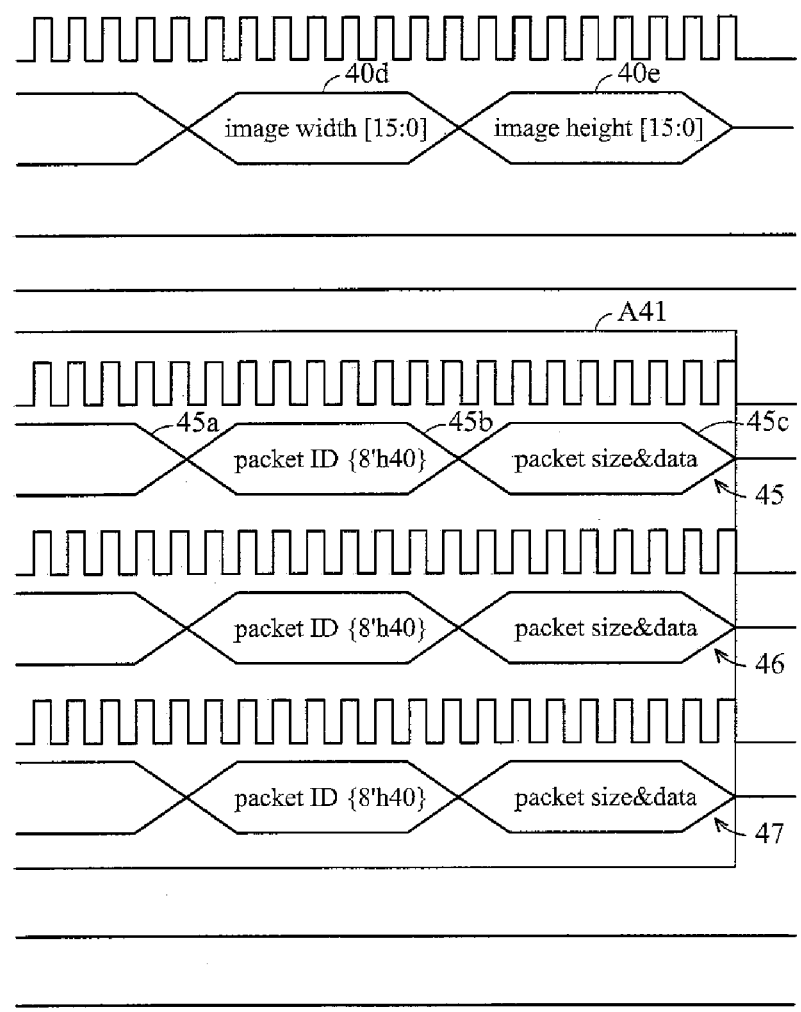

In the following, the formats of the frame start packet, the frame end packet, the line start packet, and the data packet of the serial image data stream SDS are described with FIGS. 4A-4B. In FIGS. 4A-4B, an area A41 corresponds to data to be processed. Referring to FIGS. 4A-4B, a frame start packet 40 comprises a SYNC code of 3 bytes 40a, a packet ID of 1 byte 40b, a data identification code (referred to "data ID") of 1 byte 40c, an image width code (referred to "image width") of 2 bytes 40d, and an image height code (referred to "image height") of 2 bytes 40e. In the frame start packet 40, the value of the SYNC code 40a is 24'hffffff, and the value of the packet ID 40b is "8'h01". The data ID 40c follows the packet ID 40b and indicates the image format used by the serial image data stream SDS. Table 2 shows values of data ID 40c and the corresponding image format.

TABLE 2

| image format | data ID [7:6] (CRC enable) | data ID [5:0] |
| --- | --- | --- |
| YUV422 | 2'h0 or 2'h1 | 6'h0 |
| RGB565 | 2'h0 or 2'h1 | 6'h1 |
| RAW8 | 2'h0 or 2'h1 | 6'h2 |
| JPEG | 2'h0 or 2'h1 | 6'h4 |

Referring to Table 2, the data ID [5:0] 40c is used to identify the image format used by the serial image data stream SDS. The data ID [7:6] 40c is a cyclic redundancy check code (CRC). When the value of the data ID [7:6] is "2'h0", a CRC check operation is disabled; when the value of the data ID [7:6] is "2'h1", a CRC check operation is enabled for the serial data stream SDS. In the embodiment of FIGS. 4A-4B, a YUV422 image format is given as an example for the serial image data stream SDS, and the value of the data ID 40c is thus "2'h0, 6'h0". Image information of the detected images by the image sensor 10, such as the width and height of the detected images, is represented by the image width 40d and the image height 40e which follow the data ID 40c.

Figure 4C:
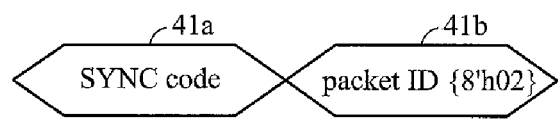

Referring to FIGS. 4A-4C, there are four line start packets 41, 42, 43, and 44 for four image sensor sensing lines. In the following, the line start packet 41 is given as an example for explanation, and the formats of the line start packets 42, 43, and 44 can be the same as that of the line start packet 41. As shown in FIGS. 4A and 4C, the start packet 41 comprises a SYNC code of 3 bytes 41a, a packet ID of 1 byte 41b, and a line identification code (referred to "line ID") of 1 byte 41c. In the line start packet 41, the value of the SYNC code 41a is 24'hffffff, and the value of the packet ID 41b is "8'h02". The line ID 41c is used to indicate the line number of the image sensor sensing line corresponding to the line start packet 41 among the image sensor sensing lines.

In FIGS. 4A-4B, there are three data packets 45, 46, and 47 for three image sensor sensing lines among the image sensor sensing lines. In the following, the data packet 45 is given as an example for explanation, and the formats of the data packets 46 and 47 can be the same as that of the data packet 45. The data packet 45 comprises a SYNC code of 3 bytes 45a, a packet ID of 1 byte 45b, and a packet size code and data (referred to "packet size&data") 45c. The packet size code occupies 2 bytes. In the data packet 45, the value of the SYNC code 45a is 24'hffffff, and the value of the packet ID 45b is "8'h40". The packet size code is used to indicate the byte size of the image data.

Referring to FIGS. 4A-4B, a frame end packet 48 comprises a SYNC code of 3 bytes 48a and a packet ID of 1 byte 48b. In the frame end packet 48, the value of the SYNC code 48a is 24'hffffff, and the value of the packet ID 48b is "8'h00". After the frame end packet 48, the serial image data stream SDS is de-asserted and invalid until next frame starts. It should be noted that, although the serial clock SC is shown as zero while the serial image data stream SDS is zero, it could also toggle while the serial image data stream SDS is zero.

Figure 5A:
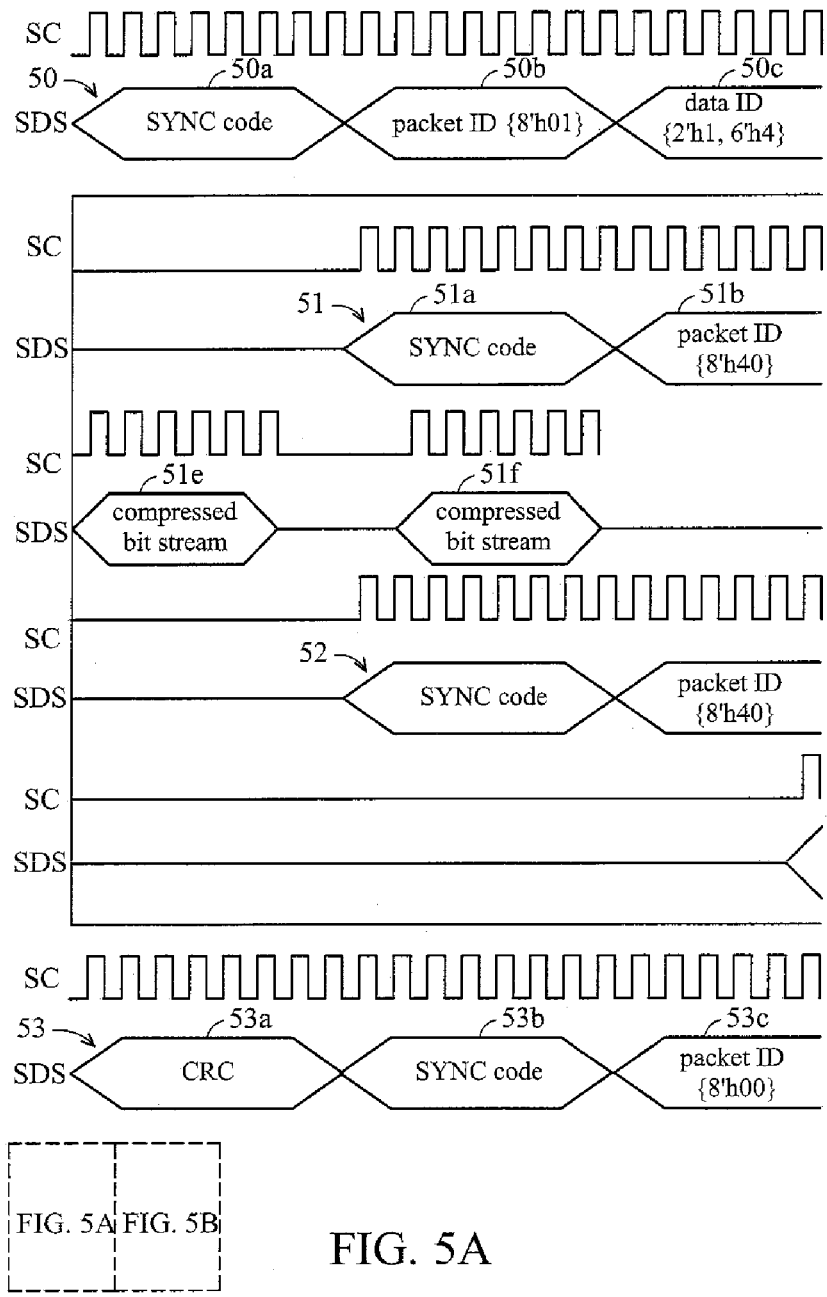
FIGS. 5A and 5B show an exemplary embodiment of the packets when the YUV422 image format is used by the serial image data stream.
Figure 5B:
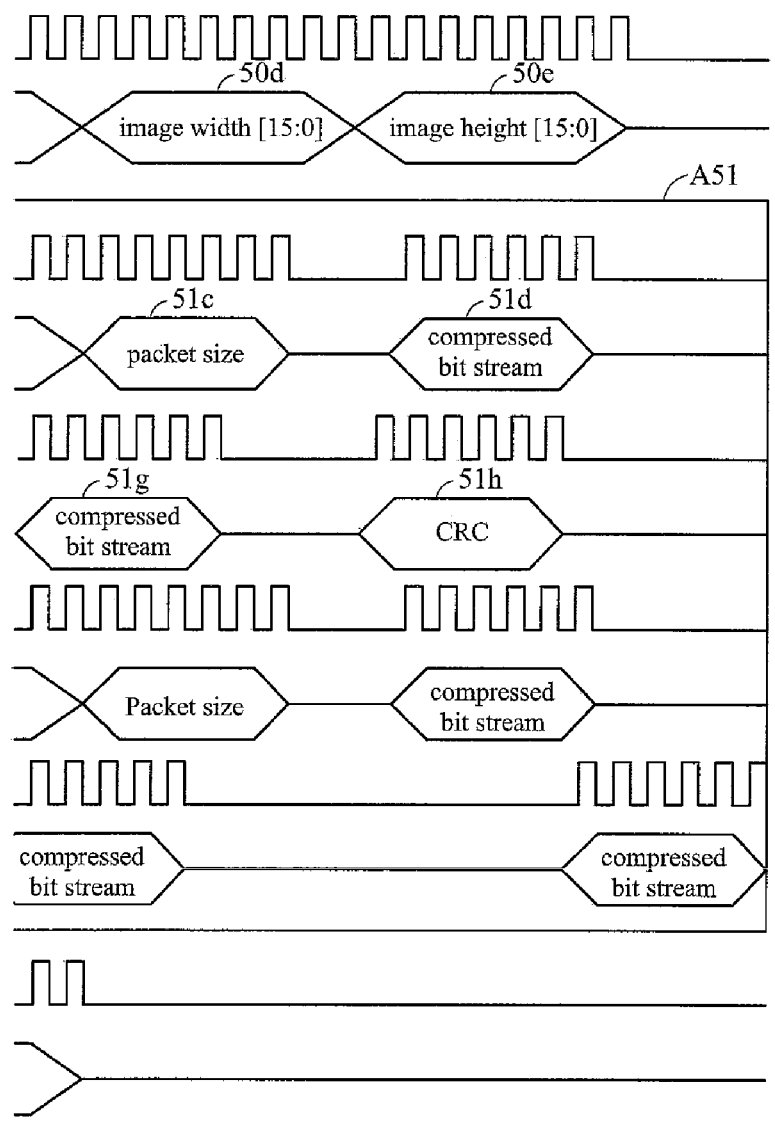

FIGS. 5A and 5B show an exemplary embodiment of the packets when the JPEG image format is used by the serial image data stream SDS. In FIGS. 5A and 5B, an area A51 corresponds to data to be processed. Referring to FIGS. 5A and 5B, the serial image data stream SDS using the JPEG image format comprises a frame start packet 50, two data packets 51 and 52, and a frame end packet 53. The frame start packet 50 comprises a SYNC code of 3 bytes 50a, a packet ID of 1 byte 50b, a data identification code (referred to "data ID") of 1 byte 50c, an image width code (referred to "image width") of 2 bytes 50d, and an image height code (referred to "image height") of 2 bytes 50e. The definition of the SYNC code 50a and the packet ID 50b is shown in the above Table 1, and the definition of the data ID 50c is shown in the above Table 2. Thus, in the frame start packet 50, the value of the SYNC code 50a is 24'hffffff, and the value of the packet ID 50b is "8'h01". The value of the data ID 50c is thus "2'h1, 6'h4" representing CRC enabled and JPEG format. Image information of the detected images by the image sensor 10, such as the width and height of the detected images, is represented by the image width 50d and the image height 50e which follow the data ID 50c.

In the following, the data packet 51 is given as an example for explanation, and the format of the data packet 52 can be similar to that of the data packet 51. The data packet 51 comprises a SYNC code of 3 bytes 51a, a packet ID of 1 byte 51b, a packet size code (referred to "packet size") 51c, compressed bit streams 51d~51g, and a CRC 51h. The packet size code occupies 2 bytes. In the data packet 51, the value of the SYNC code 51a is 24'hffffff, and the value of the packet ID 51b is "8'h40". The packet size code 51c is used to indicate the byte size of the image data. The compressed bit streams 51d~51g contain the image data. The CRC 51d is used for cyclic redundancy check of the JPEG image format.

Referring to FIGS. 5A and 5B, a frame end packet 53 comprises a CRC 53a, a SYNC code of 3 bytes 53b, and a packet ID of 1 byte 53c. In the frame end packet 53, the value of the SYNC code 53b is 24'hffffff, and the value of the packet ID 53c is "8'h00". After the frame end packet 53, the serial image data stream SDS can be de-asserted and invalid until the next frame starts.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A transmission interface, being applied in a display system, comprising:
   a first pin and a second pin;
   a conversion unit for receiving a first serial input data stream via the first pin, receiving a serial clock via the second pin, converting the first serial input data stream to parallel input data, and converting the serial clock to a parallel clock, wherein each of the first serial input data stream and the first serial clock has a full swing form, and analog circuits dealing with differential signals are omitted in the transmission interface; and
   a decoding unit for receiving and decoding the parallel input data and generating an input data signal according to the decoded parallel input data.

2. The transmission interface as claimed in claim 1, wherein the first serial input data stream is transmitted from a transmission device at double data rate.

3. The transmission interface as claimed in claim 1, wherein the conversion unit further receives a serial synchronization data stream, which has the full swing form and is merged with the first serial input data stream, via the first pin and converts the serial synchronization data stream to parallel synchronization data.

4. The transmission interface as claimed in claim 3, wherein the decoding unit further receives and decodes the parallel synchronization data and generates a first synchronization signal and a second synchronization signal according to the decoded parallel synchronization data and the parallel clock.

5. The transmission interface as claimed in claim 1 further comprising:
   a third pin for receiving a digital power; and
   a fourth pin coupled to a ground.

6. The transmission interface as claimed in claim 5 further comprising a fifth pin for receiving a second serial input data stream.

7. The transmission interface as claimed in claim 5 further comprising:
a fifth pin for receiving a second serial input data stream;
a sixth pin for receiving a third serial input data stream; and
a seventh pin for receiving a fourth serial input data stream.

8. The transmission interface as claimed in claim 1, wherein the display system comprises a transmission device.

9. The transmission interface as claimed in claim 8, wherein the transmission device is a display controller.

10. The transmission interface as claimed in claim 1, wherein the display system comprises a processing device.

11. The transmission interface as claimed in claim 10, wherein the processing device is a driver IC of a display module.

12. A transmission device for generating a first serial input data stream and a serial clock, the first serial input data stream and the serial clock are received by a transmission interface, wherein each of the first serial input data stream and the serial clock has a full swing form.

13. The transmission device as claimed in claim 12, wherein the first serial input data stream is transmitted from the transmission device at double data rate.

14. The transmission device as claimed in claim 12, wherein the transmission device is a display controller.

15. The transmission device as claimed in claim 12, wherein the transmission interface comprising:
a first pin and a second pin;
a conversion unit for receiving the first serial input data stream via the first pin, receiving the serial clock via the second pin, converting the first serial input data stream to parallel input data, and converting the serial clock to a parallel clock, wherein analog circuits dealing with differential signals are omitted in the transmission interface; and
a decoding unit for receiving and decoding the parallel input data and generating an input data signal according to the decoded parallel input data.

16. The transmission device as claimed in claim 15, wherein the conversion unit of the transmission interface further receives a serial synchronization data stream, which has the full swing form and is merged with the first serial input data stream, via the first pin and converts the serial synchronization data stream to parallel synchronization data.

17. The transmission device as claimed in claim 16, wherein the decoding unit of the transmission interface further receives and decodes the parallel synchronization data and generates a first synchronization signal and a second synchronization signal according to the decoded parallel synchronization data and the parallel clock.

18. The transmission device as claimed in claim 15, wherein the transmission interface further comprising:
a third pin for receiving a digital power; and
a fourth pin coupled to a ground.

19. The transmission device as claimed in claim 18, wherein the transmission interface further comprising a fifth pin for receiving a second serial input data stream.

20. The transmission device as claimed in claim 18, wherein the transmission interface further comprising:
a fifth pin for receiving a second serial input data stream;
a sixth pin for receiving a third serial input data stream; and
a seventh pin for receiving a fourth serial input data stream.

* * * * *